United States Patent [19]
Ventrone

[11] Patent Number: 6,054,877
[45] Date of Patent: Apr. 25, 2000

[54] LOW POWER MULTIPLEXER CIRCUIT

[75] Inventor: Sebastian T. Ventrone, South Burlington, Vt.

[73] Assignee: International Business Machines Corporation, Armonk, N.Y.

[21] Appl. No.: 09/090,107

[22] Filed: Jun. 3, 1998

[51] Int. Cl.[7] .............................. G11C 8/00; H03K 17/62; H03K 17/693; H03K 17/735

[52] U.S. Cl. ................................ 326/105; 327/407; 711/1

[58] Field of Search ........................... 326/105; 327/407; 711/1

[56] References Cited

U.S. PATENT DOCUMENTS

| | | | |
|---|---|---|---|
| 5,357,153 | 10/1994 | Chiang et al. | 327/407 |
| 5,483,660 | 1/1996 | Yishay et al. | 710/100 |
| 5,726,990 | 3/1998 | Shimada et al. | 327/407 |
| 5,802,541 | 9/1998 | Reed | 711/1 |

*Primary Examiner*—Michael Tokar
*Assistant Examiner*—Daniel D. Chang
*Attorney, Agent, or Firm*—John J. Goodwin

[57] ABSTRACT

A multiplexer circuit that provides output data signal transitions only for valid input data signals. The multiplexer includes pass gate devices and latches responsive to valid input data signals. A logic circuit responsive to a first, slow select binary input signal and a second, fast select binary input signal provides an output gating signal when the first and second binary input signals are present in the same binary state. Each pass gate device is connected to a separate input data signal from a data signal source. The pass gate devices are also connected to the output gating signal from the logic circuit such that the pass gate devices are gated and pass the input data signals in response to an output gating signal from the logic circuit upon the occurrence of the first and second binary input signals being in the same binary state. The input data signals passed by the pass gate devices are connected to latch circuits that latch and provide output signals in response to valid data signals passed through the pass gate devices.

14 Claims, 3 Drawing Sheets

LOW POWER MULTIPLEXER CIRCUIT

BACKGROUND OF THE INVENTION

1. Technical Field

The present invention relates to microprocessor systems, and more particularly to low power multiplexer circuits.

2. Background Art

Microprocessor systems are data flow intensive and incorporate large numbers of multiplexer circuits (MUXes). The multiplexer circuits control large busses that feed into power intensive function means such as multipliers. Heretofore, every transition occurring in a MUX results in a complete function being exercised. A drawback of such operation is that until real (valid) data is present on the MUX, the extra (invalid) transitions that occur are a total waste of power.

SUMMARY OF THE INVENTION

An object of the present is to provide a reduced power multiplexer circuit having two data paths and a pass gate MUX/latch that holds its value during "no select" times and two gating signals for each data path.

Another object of the present invention is to provide a reduced power multiplexer circuit wherein the ports of the multiplexer are selected to receive data by select signals and no new select is made until the data changes.

Still another object of the present invention is to provide a low power multiplexer circuit having two kinds of selects; a fast select and a slow select.

Other features, advantages and benefits of the present invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

DETAILED DESCRIPTION OF THE INVENTION

Figure 1:
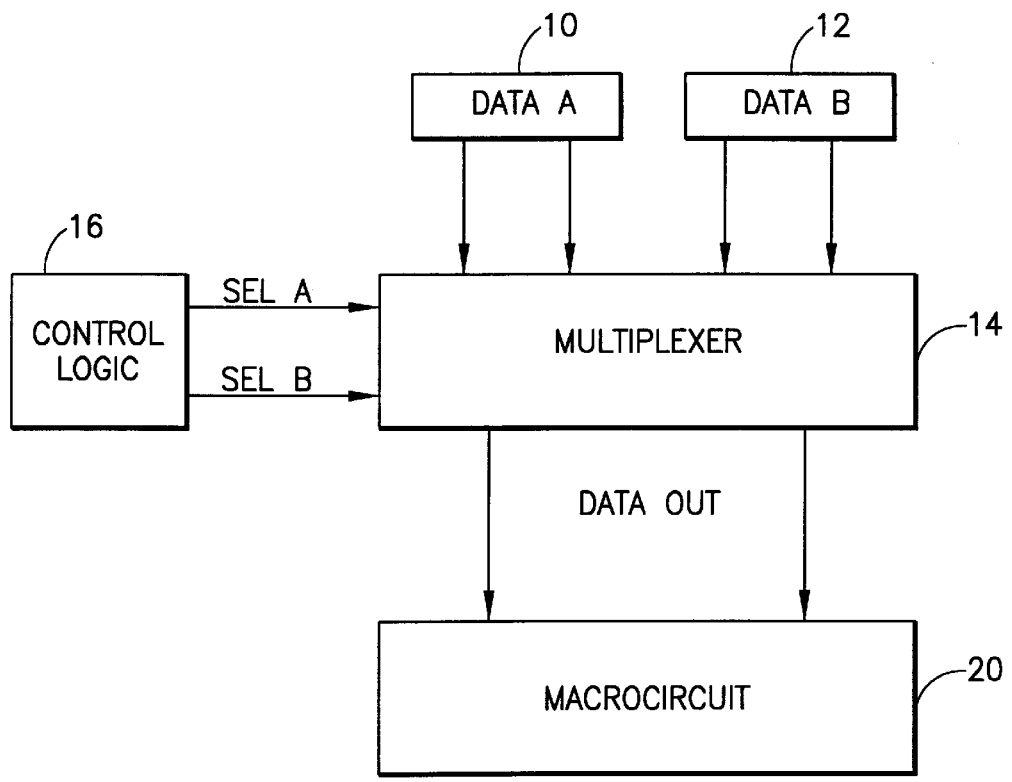
FIG. 1 is schematic block diagram of an embodiment of a typical prior art multiplexer circuit.

Referring to FIG. 1, a typical prior art multiplexer circuit is illustrated. Two data paths 10 and 12 for an n bit Data A signal and an n bit Data B signal respectively are connected to input ports of MUX circuit 14. A first gating Sel A and a second gating signal Sel B from the system control logic means 16 are applied to MUX circuit 14 for gating the Data A and the Data B signals to a utilization circuit such as macrocircuit 20.

As previously stated, every data signal transition of MUX 14 results in a complete function being exercised for both invalid as well as valid (real) data signals. The extra transitions occurring for the invalid data signals are a complete waste of power.

Figure 2:
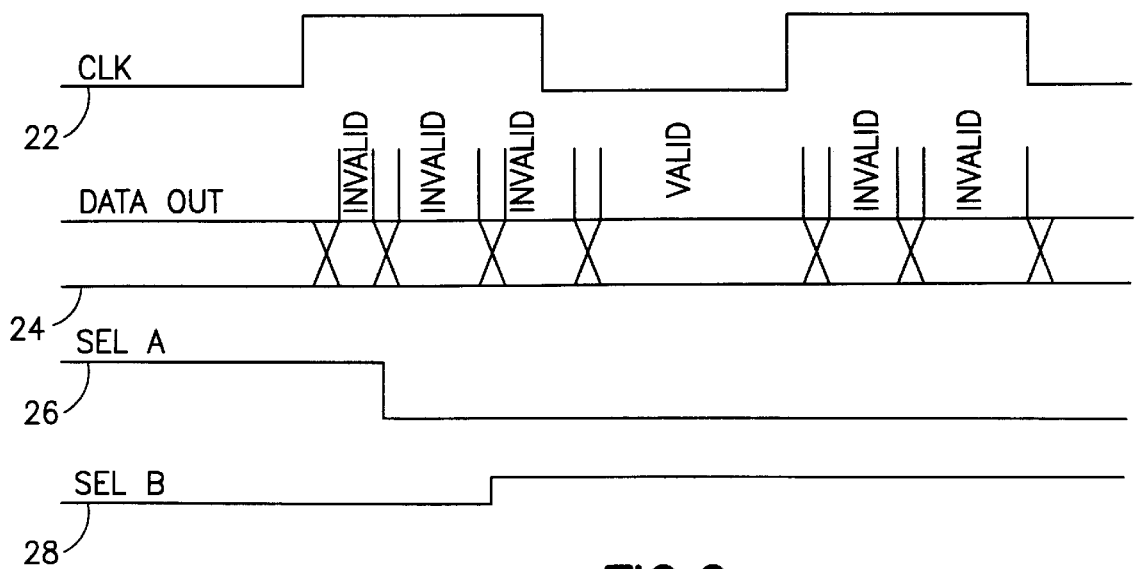
FIG. 2 is an illustration of a series of waveforms associated with the signals of the prior art multiplexer circuit of FIG. 1.

Referring to FIG. 2, a series of waveforms is shown that illustrate the operation of the MUX circuit 14 of FIG. 1. Waveform 22 is a system clock signal that is shown as a reference for the cycles of the circuit data signals. Waveform 24 illustrates the output data signals from MUX 14 that occur as a result of Data A and Data B signals gated through multiplier 14. Waveform 26 illustrates the Sel A gating signal from system control means 16 and waveform 28 illustrates the Sel B gating signal from system control means 16.

In the Data Out 24 waveform of FIG. 2, the Xs designate signal transitions. The first, second, third, fifth and sixth Xs designate invalid transitions and are wasted. The fourth and the seventh Xs designate valid data signal transitions.

The present invention provides power saving MUX circuits that function only for valid data transitions. An embodiment of a power saving MUX circuit, referred to as a "Transition Once" MUX circuit is shown in FIG. 3.

Figure 3:
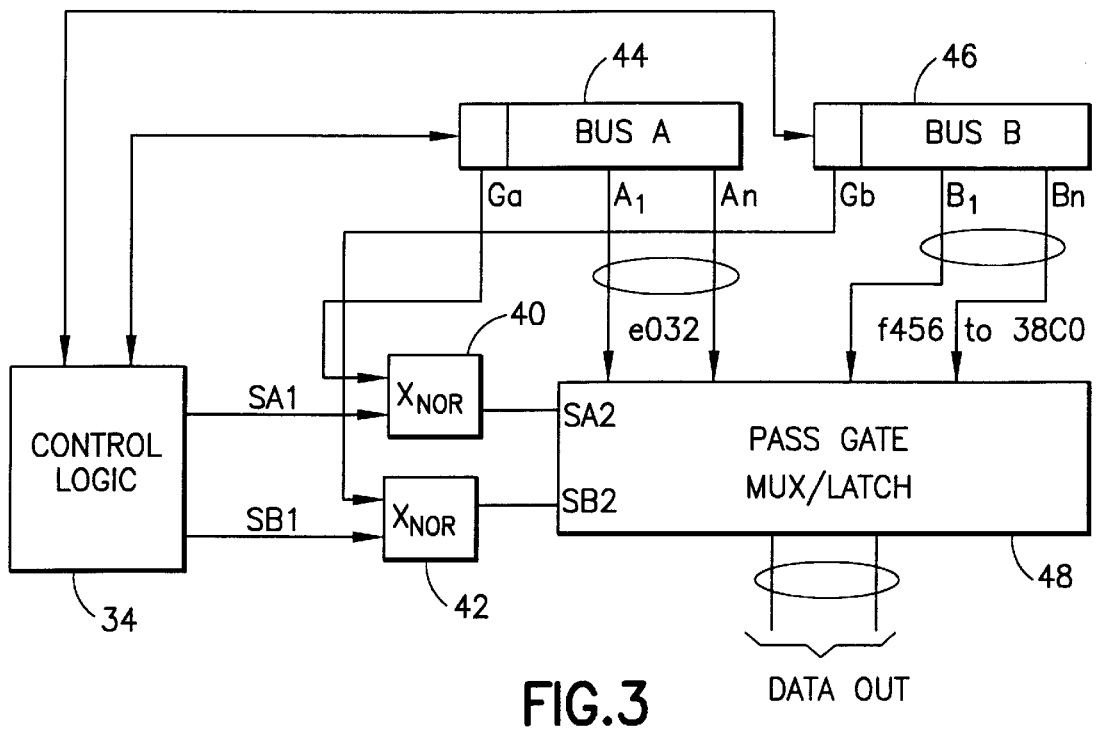
FIG. 3 is a schematic block diagram of an embodiment of a "Transition Once" MUX circuit according to the principles of the present invention.

In FIG. 3, a Bus A means 44 provides a "1" state or a "0" state output gate signal Ga that is applied as a first input signal to an Xnor circuit 40 and a Bus B means 46 provides a "1" state or "0" state output gate signal Gb that is applied as a second input signal to Xnor circuit 42. The Ga signal and the Gb signal are referred to as "slow select" signals. Bus A means 44 and bus B means 46 also provide data signals A1 . . . An and B1 . . . Bn to the input ports of a Pass Gate MUX/latch circuit 48.

Control logic circuit means 34 provides either a "1" or a "0" state output signal SA1 as the second input signal to Xnor circuit 40 and either a "1" or "0" state output signal SB1 as the second input Xnor circuit 42. The SA1 signal and the SB1 signal are referred to as "fast select" signals.

Exclusive Nor circuits Xnor 40 and Xnor 42 produce output signals SA2 and SB2 respectively only upon the occurrence of "1,1" state input signals or "0,0" state input signals, that is, the slow select Ga and the fast select SA1 input signals must both be in the "1" or the "0" state to produce an output signal SA2 from Xnor 40. Likewise, the slow select Gb and the fast select SB1 input signals must both be in the "1" state or the "0" state to produce an output signal SB2 from Xnor 42

Pass Gate MUX/latch circuit 48, is connected to the SA output signal from Xnor 40 and the SB2 output signal from Xnor 42.

Figure 4:
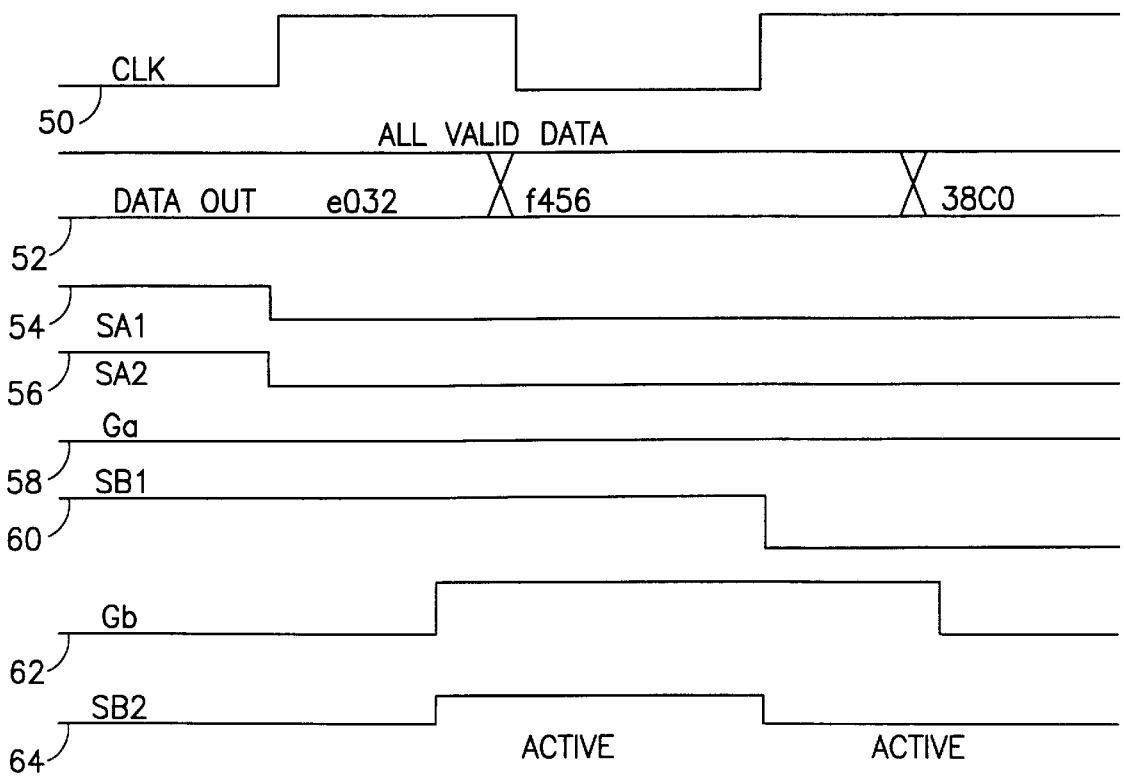
FIG. 4 is an illustration of a series of waveforms associated with the signals of the MUX circuit of FIG. 3.

Referring to FIG. 4, waveforms are illustrated that are related to the "Transition Once MUX" circuit of FIG. 3. The system clock waveform 50 is provided as a reference for the cycles of the other signals shown in FIG. 4. The Data Out waveform 52 shows the transitions of the data signal. Waveform 54 represents the fast select SA1 signal and waveform 56 represents the SA signal. Waveform 58 illustrates the slow select Ga signal, waveform 60 illustrates the fast select SB1 signal, waveform 62 illustrates the slow select Gb signal and waveform 64 illustrates the SB2 signal. In FIGS. 3 and 4 the data signals from busses 44 and 46 are given designations E032h, F456h and C0h to illustrate that they represent hexadecimal notation.

The "Transition Once MUX" circuit of FIG. 3 operates in accordance with specific rules, which are:

1. No new data is processed until select off occurs. The previous select must go away at or before new select and before the previous data changes.
2. No new select occurs before new data is received.
3. If there is a no select, data must be held either with a soft latch or a dedicated select for holding previous data.
4. If a same select occurs, a deselect takes place during data transmission, that is, the select must go inactive during data transition time.

Following these rules, for any cycle, the output of the MUX circuit 48 of FIG. 3 will transition one time only (for valid data only). The function is carried out by using two selects for every data port. One select is the fast select (SA1 for bus 44 and SB1 for bus 46), and the second select is the slow select (Ga for bus 44 and Gb for bus 46). The fast select is timed to be faster than the occurrence of the fastest data bit for that input port. The slow select is timed to arrive after the occurrence of the slowest bit of the same data port.

As shown in FIG. 3, the two selects, fast and slow, are fed into an Xnor, SA1 and Ga into Xnor 40 and SB1 and Gb into Xnor 42. Each select must be the same value (either both "0" or both "1") to produce an output (SA or SB2) to the MUX 48 to gate the data bits at the input port to the output stage as data output signals. Between the input and the output stages MUX 48 contains a soft latch circuit means to hold the output stage either during a selection to a new data port, or if no pair of selects are active. If the same output port is to be selected from one cycle to another, then both selects are toggled (if both "0", then on the next cycle both would be "1"). By toggling the select, the input port is deselected during the input data transition. The fast select (SA1 or SB1) will go to the new state before the corresponding slow select (Ga or Gb), temporally disconnecting the input port from the output during the transition at the input port. Once the slow select changes to the same value as the fast select, the data transition is complete, the Mux 48 is gated, and the new value at the selected input port is allowed to pass to the output stage.

By cutting down the intermediate transition of the data in the MUX, false transitions for invalid data are prevented from occurring. Until the data on the MUX is real, the downstream path should not be toggling. By using the "Once Transition MUX" circuit of FIG. 3, to prevent transitions for invalid data, the AC power of the data paths is significantly reduced.

Figure 5:
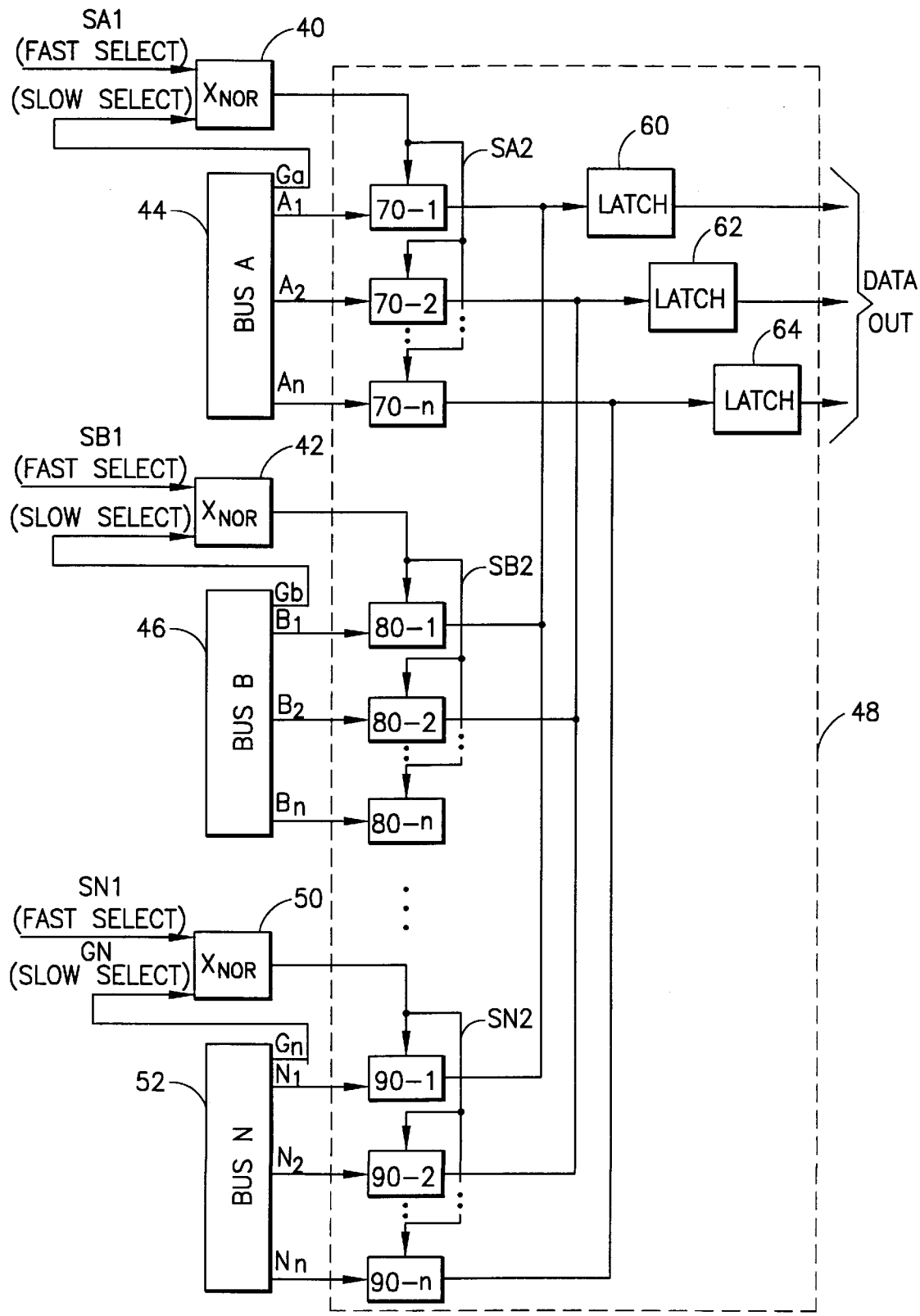
FIG. 5 is a more detailed schematic block diagram of the embodiment of a the "Transition Once" MUX circuit illustrated in FIG. 3.

Referring to FIG. 5, a more detailed schematic circuit of the "Transition Once" Mux is illustrated. In FIG. 3 an example of two groups of data bits A1 . . . An and B1 . . . Bn from buses A and B (44 and 46) is shown. In FIG. 5 the more general case of N groups of data bits from N buses is considered. Fast select signals SA1, SB1, . . . SN1 from the system control logic are applied to Xnor circuits 40, 42, . . . 50 respectively. Likewise, slow select signals Ga, Gb, . . . Gn are also applied to Xnor circuits 40, 42, . . . 40n. The output signals SA, SB2, . . . SN2 from the Xnor circuits 40, 42 . . . 50 are generated in the same manner as described for FIG. 3. In the pass gate multiplexer and latch circuit 48 in FIG. 5 the SA . . . SN2 signals are applied to transistor pass gate circuits 70-1, 70-2, 70-n through 90-1 90-2 90-n to gate the data bits A1, A2, An . . . N1, N2, Nn to soft latch circuit means 60, 62, and 64. The soft latch circuit means 60. 62 and 64 hold the pass gate multiplier and latch circuit 48 output stage either during a selection to a new data port, or if no pair of selects are active.

Thus, a "transition once" multiplier apparatus is provided that undergoes data signal transitions only for valid (real) data signals. The multiplexer apparatus is selected to receive data by the operation of binary select signals, and no new select is made until the data changes.

While the invention has been described in connection with a preferred embodiment, it is not intended to limit the scope of the invention to the particular form set forth, but on the contrary, it is intended to cover such alternatives, modifications and equivalence as may be included within the spirit and scope of the invention as defined in the appended claims.

What is claimed is:

1. A low power multiplexer apparatus that provides output data signal transitions only for valid input data signals comprising a pass gate multiplexer and latch circuit responsive to a group of n input data signals from at least one data signal source, at least one logic circuit responsive to a first, slow select binary input signal and a second, fast select binary input signal, said at least one logic circuit providing an output gating signal when said first and second binary input signals are present in the same binary state, said pass gate multiplexer and latch circuit including at least one group of n gate devices, each gate device connected to a separate data signal of said group of n input data signals from said at least one data signal source, said n gate devices also connected to said output gating signal of said at least one logic circuit wherein said n gate devices are gated and pass said n data signals in response to an output gating signal from said at least one logic circuit upon the occurrence of said first and second binary input signals being in the same binary state.

2. The multiplexer apparatus of claim 1 wherein said pass gate multiplexer and latch circuit further includes n latch circuits each connected to the output of a separate one of said n gate devices of said at least one group of n gate devices for latching and providing output signals in response to valid data signals passed through said gate devices.

3. The multiplexer apparatus of claim 1 wherein said at least one logic circuit is an exclusive Nor circuit.

4. The multiplexer apparatus of claim 1 wherein said pass gate multiplexer and latch circuit is responsive to separate selected groups of n data signals from N data signal sources, and includes N logic circuits each responsive to a first, slow select binary input signal and a second, fast select binary input signal, each of said N logic circuits providing an output signal when said first and second binary input signals thereto are in the same binary state, said pass gate multiplexer and latch circuit including N groups of n gate devices, each gate device of each of said N groups connected to a separate data signal of said groups of n data signals from said N data signal sources, each of said n gate devices of said N groups of gate devices also connected to said output of one of said N exclusive Nor circuits wherein said n gate devices pass said n data signals in response to an output signal from said exclusive Nor circuit upon the occurrence of said first and second binary input signals in the same binary state.

5. The multiplexer apparatus of claim 1 wherein said pass gate multiplexer and latch circuit further includes n latch circuits each connected to the output of a separate one of said n gate devices of each of said N groups of n gate devices for latching and providing output signals in response to valid data signals passed through said gate devices.

6. The multiplexer apparatus of claim 5 wherein said N logic circuits are exclusive Nor circuit.

7. The multiplexer apparatus of claim 1 wherein said fast select binary input signal occurs before the occurrence of the fastest occurring data signal of said n data signals from said at least one data signal source.

8. The multiplexer apparatus of claim 7 wherein said slow select binary input signal occurs after the occurrence of the slowest occurring data signal of said n data signals from said at least one data signal source.

9. The multiplexer apparatus of claim 4 wherein said fast select binary input signal occurs before the occurrence of the fastest occurring data signal of said n data signals from said at least one data signal source.

10. The multiplexer apparatus of claim 9 wherein said slow select binary input signal occurs after the occurrence of the slowest occurring data signal of said n data signals from said at least one data signal source.

11. The multiplexer apparatus of claim 10 wherein, between the occurrence of a group of n data signals from one of said N data signal sources and the selection and transition to another group of n data signals from said N data signal sources, said fast select signal changes binary state before the slow select signal changes binary state and therefore said latch circuits remain latched during said transition until said slow select signal changes to the same binary state as said fast select signal.

12. A method for multiplexing input data signals that provides output data signal transitions only for valid input data signals comprising the steps of providing a group of n input data signals from at least one data signal source, providing a first, slow select binary signal and a second, fast select binary signal, and gating the group of n input data signals to provide output signals representative of the n input signals when the first and second binary input signals are present in the same binary state.

13. The method of claim 12 further including the steps of providing at least one group of n gate devices connected to the input data signals of the group of n input data signals from the at least one data signal source, and actuating the n gate devices to pass the input data signals through the gate devices upon the occurrence of the first and second binary input signals being in the same binary state.

14. The method of claim 13 further including the steps of providing latch circuits connected to the input data signals passed through the gate devices, and actuating the latch circuits to provide output signals in response to the input data signals passed through the gate devices.

* * * * *